(12) United States Patent
Li

(10) Patent No.: US 9,291,858 B2
(45) Date of Patent: Mar. 22, 2016

(54) DISPLAY PANEL AND MANUFACTURING METHOD THEREOF AND DISPLAY DEVICE

(71) Applicant: BOE TECHNOLOGY GROUP CO., LTD., Beijing (CN)

(72) Inventor: Mingchao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 14/126,756

(22) PCT Filed: Nov. 16, 2012

(86) PCT No.: PCT/CN2012/084755
§ 371 (c)(1),
(2) Date: Dec. 16, 2013

(87) PCT Pub. No.: WO2013/174111
PCT Pub. Date: Nov. 28, 2013

(65) Prior Publication Data
US 2014/0111726 A1    Apr. 24, 2014

(30) Foreign Application Priority Data
May 25, 2012   (CN) .......................... 2012 1 0166907

(51) Int. Cl.
  *G02F 1/1337*   (2006.01)
  *G03F 7/20*     (2006.01)
  *G02F 1/1335*   (2006.01)

(52) U.S. Cl.
  CPC .... *G02F 1/133784* (2013.01); *G02F 1/133555* (2013.01); *G02F 1/133788* (2013.01); *G03F 7/20* (2013.01); *G02F 2001/133565* (2013.01)

(58) Field of Classification Search
  CPC ................... G02F 1/133555; G02F 1/133784; G02F 1/133788; G02F 2001/133565; G03F 7/20

USPC .................. 430/321; 349/113, 114, 124, 126
See application file for complete search history.

(56) References Cited

U.S. PATENT DOCUMENTS

2004/0032555 A1*   2/2004   Jin ................... G02F 1/133555
                                                             349/114
2007/0126963 A1    6/2007   Yang et al.
(Continued)

FOREIGN PATENT DOCUMENTS

CN    1617035 A    5/2005
CN    1734321 A    2/2006
(Continued)

OTHER PUBLICATIONS

First Office Action issued by the Chinese Patent Office for Chinese Patent No. 201210166907.6 dated Mar. 31, 2014, 6pgs.
(Continued)

*Primary Examiner* — John A McPherson
(74) *Attorney, Agent, or Firm* — Ladas & Parry LLP

(57) ABSTRACT

Provided are a display panel and a manufacturing method therefor and a display device. The display panel comprises: a color film substrate and an array substrate, which are engaged with each other; and liquid crystals arranged between the color film substrate and the array substrate. The array substrate comprises a substrate (1) and a pixel unit layer (2) and an alignment layer (3) which are formed on the substrate (1) in sequence, wherein the alignment layer (3) comprises: a first alignment layer (5) covered on the pixel unit layer (2), a reflection layer (4) formed on the first alignment layer (5) in a position corresponding to a reflection region, and a second alignment layer (6) formed above the reflection layer (4).

15 Claims, 3 Drawing Sheets

(56) References Cited

U.S. PATENT DOCUMENTS

| | | | | |
|---|---|---|---|---|
| 2007/0182900 A1* | 8/2007 | Hsiao | ............... | G02F 1/133555 349/128 |
| 2008/0192190 A1* | 8/2008 | Lee | .................. | G02F 1/133555 349/114 |
| 2010/0225855 A1* | 9/2010 | Lu | .................... | G02F 1/133555 349/96 |
| 2011/0310339 A1* | 12/2011 | Itoh | .................. | G02F 1/133788 349/124 |
| 2012/0008077 A1 | 1/2012 | Chen et al. | | |
| 2014/0111726 A1 | 4/2014 | Li | | |

FOREIGN PATENT DOCUMENTS

| | | | |
|---|---|---|---|
| CN | 1979286 | A | 6/2007 |
| CN | 1979310 | A | 6/2007 |
| CN | 101556406 | A | 10/2009 |
| CN | 101893789 | A | 11/2010 |
| CN | 102707498 | A | 10/2012 |
| JP | 2007240726 | A | 9/2007 |

OTHER PUBLICATIONS

English translation of First Office Action issued by the Chinese Patent Office for Chinese Patent No. 201210166907.6 dated Mar. 31, 2014, 3pgs.

International Search Report for International Application No. PCT/CN2012/084755, 16pgs, (Mar. 2013).

English translation of Chinese Patent No. 1734321, 34pgs, (Feb. 2006).

English translation of Chinese Patent No. 1979286, 20pgs, (Jun. 2007).

English translation of Chinese Patent No. 101556406, 21pgs, (Oct. 2009).

English translation of Chinese Patent No. 101893789, 18pgs, (Nov. 2010).

English translation of Chinese Patent No. 102707498, 15pgs, (Oct. 2012).

English translation of Japanese Patent No. 2007240726, 36pgs, (Sep. 2007).

Second Office Action issued by the State Intellectual Property Office of People's Republic of China, for Chinese Patent Application No. 201210166907.6, dated Oct. 20, 2014, with Search Report; 6pages.

English translation of Second Office Action issued by the State Intellectual Property Office of People's Republic of China, for Chinese Patent Application No. 201210166907.6, dated Oct. 20, 2014, with Search Report; 4 pages.

PCT International Preliminary Report on Patentability, for PCT application No. PCT/CN2012/084755, dated Nov. 25, 2014; 13 pages.

English Translation of Abstract of CN1617035A (cited above); 1 page, (May 2005).

* cited by examiner

DISPLAY PANEL AND MANUFACTURING METHOD THEREOF AND DISPLAY DEVICE

CROSS REFERENCE TO RELATED APPLICATIONS

This application is based on International Application No. PCT/CN2012/084755 filed on Nov. 16, 2012, which claims priority to Chinese National Application No. 201210166907.6 filed on May 25, 2012, the contents of which are incorporated herein by reference.

FIELD OF THE INVENTION

Embodiments of the present invention relate to a display panel and manufacturing method thereof and a display device.

BACKGROUND

In the manufacturing engineering of liquid crystal displays, traditional alignment layer rubbed methods all are the case that the same substrate has the same alignment, and thus display devices have an advantage of displaying in only one display mode, and meanwhile the disadvantage of this mode is revealed as well. Combing advantages and disadvantages of various modes becomes a goal of the display field. The transflective mode display is such a display mode that combines transmission with reflection. With this mode, the performance of applied products is improved, and the application field of applied products is enlarged, and so the enthusiasm to research and development is also growing with each passing day. Taking a panoramic view of the development status of the display field, in the display products to be used outdoors, the transflective mode has attracted a lot of attention.

Photosensitive polymers, as active polymer materials, the scope of application of them is also expanding increasingly. In the use of photosensitive polymers, stability and degradation of the photosensitive polymers are mostly carried on by illumination. A spin coating process may be conducted on a plastic substrate, or on a glass substrate after addition of an adhesive, after volatilization of an organic solvent, an alignment process is performed, and after that, ultraviolet irradiation is carried on to stabilize the photosensitive polymers, so as to achieve an orientation effect.

As found by inventors, in a traditional process, the conventional alignment process of transflection is that, a resin material is used to form a stepwise layered structure firstly, and then a rubbing alignment process is conducted on the stepwise substrate. Such a process results in occurrence of technological poorness at the boundary between steps, and in turn, the overall quality of the picture is affected.

SUMMARY

According to an embodiment of the invention, there is provided a manufacturing method of a display panel, comprising: forming a pixel unit layer on a substrate; forming a first photosensitive polymer layer on the pixel unit layer; performing rubbing alignment in a first direction on the first photosensitive polymer layer; drying and illumination curing the first photosensitive polymer layer to form a first aligning layer; forming a reflective layer on the first aligning layer at a location corresponding a reflective area; forming a second photosensitive polymer layer on the first aligning layer and the reflective layer; performing rubbing alignment in a second direction on the second photosensitive polymer layer; conducting drying treatment on the second photosensitive polymer layer and conducting illumination curing treatment on the second photosensitive polymer layer directly above the reflective layer via a mask to form a second aligning layer, so as to obtain an array substrate; and cell-assembling the array substrate with a color filter substrate and filling liquid crystals between them.

According to another embodiment of the invention, there is provided a display panel, comprising: a color filter substrate and an array substrate that are cell-assembled; and liquid crystals, disposed between the color filter substrate and the array substrate, wherein the array substrate includes a substrate and a pixel unit layer and an aligning layer that are formed on the substrate in sequence, and wherein the aligning layer includes: a first aligning layer covering the pixel unit layer; a reflective layer that is formed on the first aligning layer and exists at a location corresponding to a reflective area; and a second aligning layer formed directly above the reflective layer.

According to still another embodiment of the invention, there is provided a display device, comprising the display panel as stated above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A manufacturing method of an array substrate provided by an embodiment of the invention includes the following steps.

S101, a pixel unit layer 2 is formed on a substrate 1.

Certainly, according to the existing technology, the pixel unit layer here may include gate lines and data lines that crisscross over each other, and pixel units defined by the data lines and the gate lines. A pixel unit includes a switch element, which is generally a Thin Film Transistor (TFT) switch. The TFT switch includes a source electrode, a drain electrode, a gate electrode and an active layer. In a twisted nematic (TN) display panel, the pixel unit layer further includes pixel electrodes connected to drain electrodes of TFT switches; and in an In-Plane Switching (IPS) mode display panel and a Fringe Field Switching (FFS) mode display panel, the pixel unit layer further includes a common electrode layer. For the array substrate according to embodiments of the invention, there is no specific limit on structure of the pixel units, and the pixel structure of any suitable type can be used.

In addition, the pixel unit layer may further include a passivation layer covering it, which serves to protect electrical devices in the pixel unit layer.

S102, a first photosensitive polymer layer 50 is formed on the pixel unit layer 2.

S103, rubbing alignment in a first direction is conducted on the first photosensitive polymer layer 50.

Figure 1:
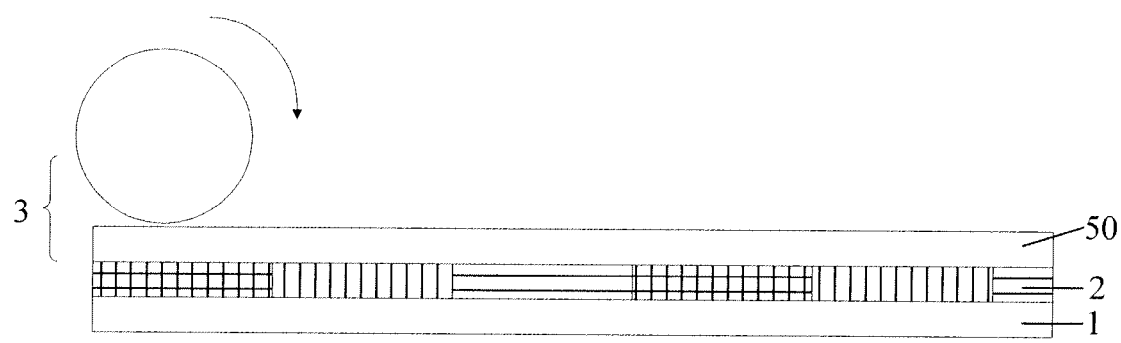
FIG. 1 is a schematic view illustrating a structure 1 in a manufacturing process of a display panel provided by an embodiment of the invention.

By reference to that illustrated in FIG. 1, the first photosensitive polymer layer 50 includes a photosensitive polymer material and a volatile solvent.

As selectable, the photosensitive polymer material includes at least one selected from the group consisting of polyvinyl cinnamate, poly(ethylene oxide ethyl cinnamate), poly (p-phenylene diacrylate), poly(vinyl cinnamylidene acetate), divinyl-benzene, N,N-methylene-bis-acrylamide, ethylene diacrylate and benzoin esterase; the volatile solvent includes at least one selected from the group consisting of acetone, ethanol and cycloalkanes.

S104, drying and curing by illumination are conducted on the first photosensitive polymer layer 50, so as to form a first aligning layer 5.

Figure 2:
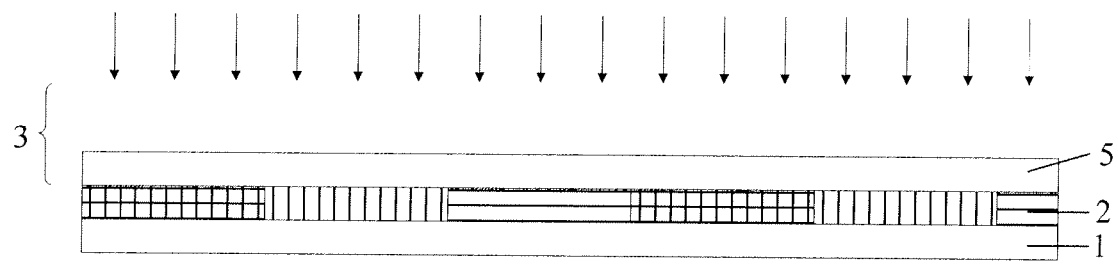
FIG. 2 is a schematic view illustrating a structure 2 in the manufacturing process of the display panel provided by the embodiment of the invention.

By reference to that illustrated in FIG. 2, in a selectable manner, the array substrate is placed in an environment at 80° C. to 100° C. for four to six minutes to dry the first photosensitive polymer layer 50, so that the volatile solvent in the first photosensitive polymer layer 50 volatilizes, and next, photocuring is carried on the first photosensitive polymer layer 50 by ultraviolet irradiation, so as to form the first aligning layer 5.

S105, a reflective layer 4 is formed on the first aligning layer 5 at a location corresponding to a reflective area, and material for the reflective layer 4 is such as metal.

Figure 3:
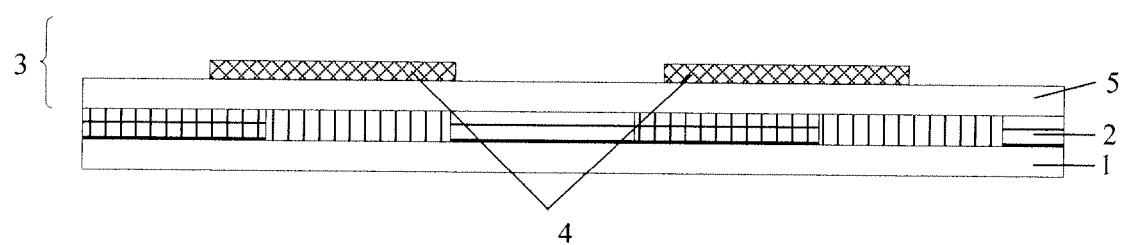
FIG. 3 is a schematic view illustrating a structure 3 in the manufacturing process of the display panel provided by the embodiment of the invention.

As illustrated in FIG. 3, as selectable, the reflective layer 4 may be of metal aluminum, and besides, area of the reflective layer 4 occupies ½ in each pixel unit of the display panel.

S106, a second photosensitive polymer layer 60 is formed on the first aligning layer 5 and the reflective layer 4.

S107, rubbing alignment in a second direction is performed on the second photosensitive polymer layer 60.

Figure 4:
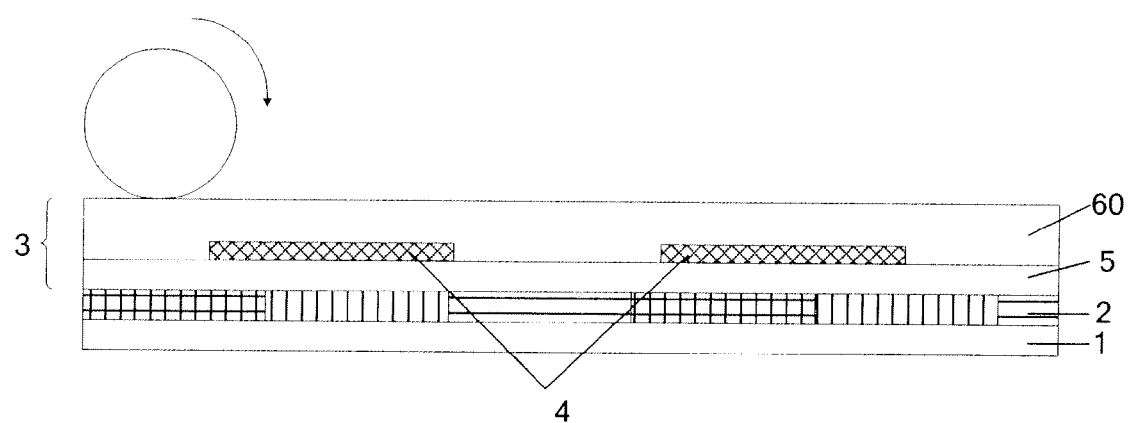
FIG. 4 is a schematic view illustrating a structure 4 in the manufacturing process of the display panel provided by the embodiment of the invention.

By reference to that illustrated in FIG. 4, the second photosensitive polymer layer 60 includes a photosensitive polymer material and a volatile solvent; as selectable, the photosensitive polymer material includes at least one selected from the group consisting of polyvinyl cinnamate, poly(ethylene oxide ethyl cinnamate), poly (p-phenylene diacrylate), poly (vinyl cinnamylidene acetate), divinyl-benzene, N,N-methylene-bis-acrylamide, ethylene diacrylate and benzoin esterase; the volatile solvent includes at least one selected from the group consisting of acetone, ethanol and cycloalkanes.

In addition, as selectable, the second direction employed by the rubbing alignment here may be the same as the first direction chosen for manufacture of the first aligning layer 5, or a different orientation direction is adopted according to requirements.

Figure 5:
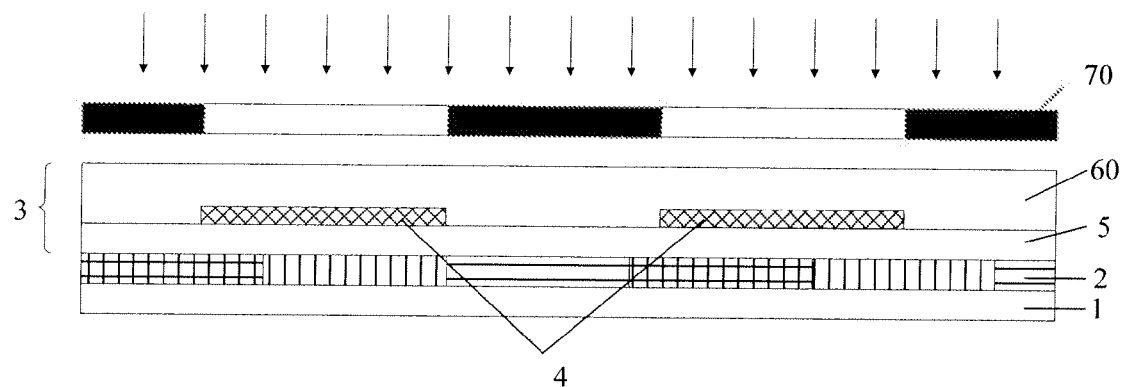
FIG. 5 is a schematic view illustrating a structure 5 in the manufacturing process of the display panel provided by the embodiment of the invention.
Figure 6:
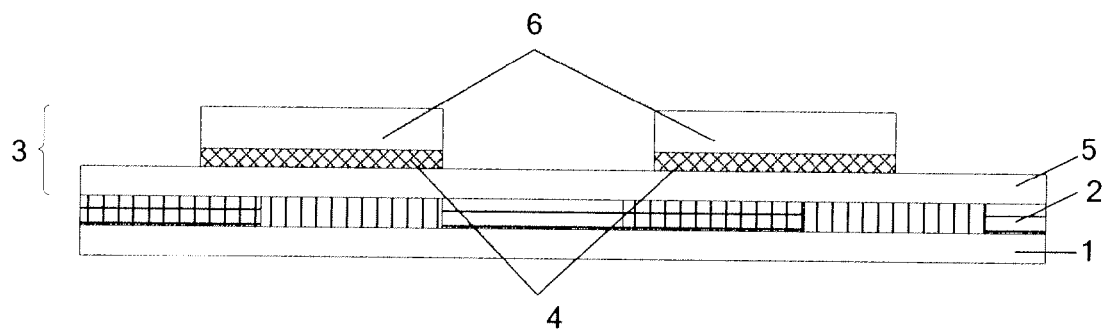
FIG. 6 is a schematic view illustrating a structure 6 in the manufacturing process of the display panel provided by the embodiment of the invention.

S108, drying treatment is performed on the second photosensitive polymer layer 60, and illumination curing treatment is conducted on the second photosensitive polymer layer 60 directly above the reflective layer 4 via a mask to form a second aligning layer 6, so as to attain an array substrate;

By reference to that illustrated in FIG. 5, in a selectable manner, the array substrate is placed in an environment at 80° C. to 100° C. for four to six minutes to dry the first photosensitive polymer layer 50, so that the volatile solvent in the first photosensitive polymer layer 50 volatilizes, and next, the second photosensitive polymer layer 60 directly above the reflective layer 4 of metal is photocured by irradiation with ultraviolet via a mask 70, so as to form the second aligning layer 6, as illustrated in FIG. 6. Here, since the aligning layer in a reflective area and the aligning layer in a transmissive area on the array substrate are subjected to rubbing alignment separately, a phenomenon of poor rubbing at the boundary between a first aligning layer and a second aligning layer that is caused by using a one-time rubbing alignment technology in the traditional process is avoided from occurring.

Furthermore, after photocuring is conducted on the photosensitive polymer layer directly above the reflective layer via the mask 70, a step of removing the polymer material layer in a region other than the reflective layer may further be included. As the polymer material layer in this region is not cured for not being exposed to light, it can be easily removed by any suitable method. For example, any suitable solvent can be used to remove the portion that has not been irradiated by light.

S109, the array substrate and a color filter substrate that is formed by manufacture are cell-assembled, and liquid crystals are filled.

With respect to the manufacturing method of display panel provided by embodiments of the invention, photosensitive polymer material is used for manufacture of the aligning layer, and the rubbing alignment process is conducted step by step, so that occurrence of poor rubbing process of a transflective liquid crystal display can be avoided. Thus, the overall quality of the picture is improved.

Figure 7:
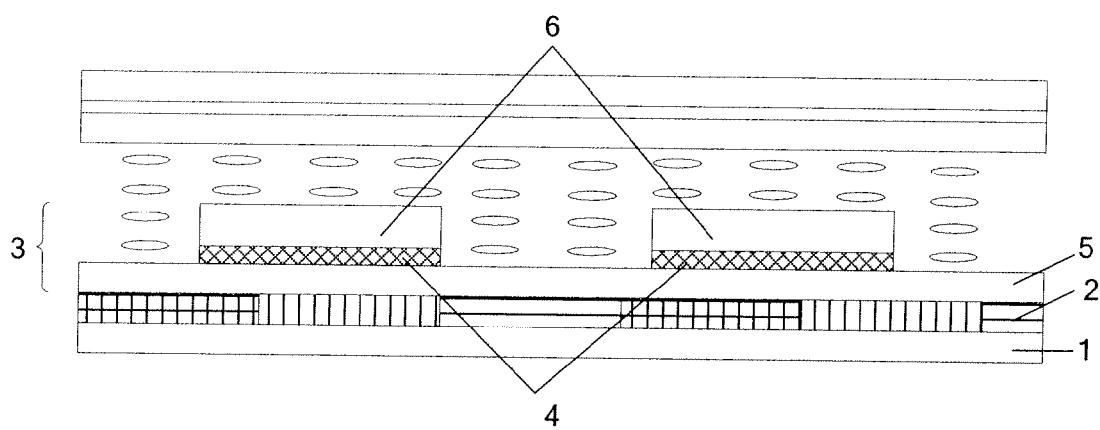
FIG. 7 is a schematic view illustrating the structure of a display panel provided by an embodiment of the invention.

As illustrated in FIG. 7, a display panel provided by an embodiment of the invention includes:

a color filter substrate and an array substrate that are formed by cell-assembling, wherein liquid crystals are contained between the color filter substrate and the array substrate. The array substrate includes a substrate 1, a pixel unit layer 2 and the aligning layer 3, wherein the aligning layer 3 includes:

a first aligning layer 5 covering the pixel unit layer 2;

a reflective layer 4 that is formed on the first aligning layer 5 and exists at a location corresponding to a reflective area;

a second aligning layer 6 formed directly above the reflective layer 4.

The pixel unit layer 2 may includes pixel units surrounded by gate lines and data lines, and a passivation layer cover the pixel units, and a pixel unit may include a switch element. In addition, the pixel unit may further include a pixel electrode, a common electrode and/or other part.

With respect to the display panel provided by embodiments of the invention, photosensitive material is used for manufacture of the aligning layer of the array substrate, and the rubbing alignment process is conducted step by step, so that poorness of rubbing process of a transflective liquid crystal display can be avoided from occurring. Thus, the overall quality of the picture is improved.

Besides, the total thickness of the second aligning layer 6 and the reflective layer 4 is one half of the thickness of a liquid crystal cell of the display panel, so as to maintain optical path in a transmissive region and in a reflective region uniform. Further, as selectable, area of the reflective layer 4 occupies one half in each pixel unit of the display panel, so as to realize improvement in outdoor visibility of the display panel.

According to an embodiment of the invention, there is provided a display device, comprising the above display panel. Besides, the display device may also be a display apparatus of various display modes including TN (Twisted Nematic), IPS (In-Plane Switching), FFS (Fringe Field Switching), etc., such as, an electronic paper, a cell phone, a television, a digital photo frame, or the like.

With respect to the display device provided by embodiments of the invention, photosensitive polymer material is used for manufacture of the aligning layer of the array substrate, and the rubbing alignment process is conducted step by step, so that poorness of rubbing process of a transflective liquid crystal display can be avoided from occurring. Thus, the overall quality of the picture is improved.

According to embodiments of the invention, at least the following methods and structure can be provided.

(1). A manufacturing method of a display panel, comprising:
forming a pixel unit layer on a substrate;
forming a first photosensitive polymer layer on the pixel unit layer;
performing rubbing alignment in a first direction on the first photosensitive polymer layer;
drying and illumination curing the first photosensitive polymer layer to form a first aligning layer;
forming a reflective layer on the first aligning layer at a location corresponding a reflective area;
forming a second photosensitive polymer layer on the first aligning layer and the reflective layer;
performing rubbing alignment in a second direction on the second photosensitive polymer layer;
conducting drying treatment on the second photosensitive polymer layer and conducting illumination curing treatment on the second photosensitive polymer layer directly above the reflective layer via a mask to form a second aligning layer, so as to obtain an array substrate; and
cell-assembling the array substrate with a color filter substrate and filling liquid crystals between them.

(2). The manufacturing method in accordance with (1), wherein the first photosensitive polymer layer and the second polymer layer includes: a photosensitive polymer material and a volatile organic solvent.

(3). The manufacturing method in accordance with (2), wherein the photosensitive polymer material includes at least one selected from the group consisting of polyvinyl cinnamate, poly(ethylene oxide ethyl cinnamate), poly (p-phenylene diacrylate), poly(vinyl cinnamylidene acetate), divinyl-benzene, N,N-methylene-bis-acrylamide, ethylene diacrylate and benzoin esterase.

(4). The manufacturing method in accordance with (2) or (3), wherein the volatile solvent includes at least one selected from the group consisting of acetone, ethanol and cycloalkanes.

(5). The manufacturing method in accordance with any of (1) to (4), wherein the reflective layer is of aluminum.

(6). The manufacturing method in accordance with any of (1) to (5), wherein the first direction and the second direction are the same or different.

(7). The manufacturing method in accordance with any of (1) to (7), wherein the illumination curing is an illumination curing with ultraviolet.

(8). The manufacturing method in accordance with any of (1) to (7), wherein the drying treatment is that it is placed in an environment at 80° C. to 100° C. for four to six minutes.

(9). The manufacturing method in accordance with any of (1) to (8), wherein, after drying treatment is performed on the second photosensitive polymer layer and illumination curing treatment is performed on the second photosensitive polymer layer over the reflective layer via a mask, it further includes removing the second photosensitive polymer layer in other region than the reflective layer, so as to expose the first aligning layer uncovered by the reflective layer.

(10). The manufacturing method in accordance with any of (1) to (9), wherein the pixel unit layer comprises:
pixel units surrounded by gate lines and data lines, the pixel units comprising switch elements; and
a passivation layer covering the pixel units.

(11). A display panel, comprising:
a color filter substrate and an array substrate that are cell-assembled; and
liquid crystals, disposed between the color filter substrate and the array substrate,
wherein the array substrate includes a substrate and a pixel unit layer and an aligning layer that are formed on the substrate in sequence, and
wherein the aligning layer includes:
a first aligning layer covering the pixel unit layer;
a reflective layer that is formed on the first aligning layer and exists at a location corresponding to a reflective area; and
a second aligning layer formed directly above the reflective layer.

(12). The display panel in accordance with (11), wherein a total thickness of the second aligning layer and the reflective layer is one half of thickness of a liquid crystal cell of the display panel.

(13). The display panel in accordance with (11) or (12), wherein the pixel unit layer comprises:
pixel units surrounded by gate lines and data lines, the pixel units comprising switch elements; and
a passivation layer covering the pixel units.

(14). The display panel in accordance with (13), wherein area of the reflective layer occupies one half in each of the pixel units of the display panel.

(15). A display device, comprising the display panel in accordance with any of (9) to (14).

The foregoing is merely exemplary embodiments of the invention, but is not used to limit the protection scope of the invention. The protection scope of the invention shall be defined by the attached claims.

What is claimed is:
1. A manufacturing method of a display panel, comprising:
forming a pixel unit layer on a substrate;
forming a first photosensitive polymer layer on the pixel unit layer;
performing rubbing alignment in a first direction on the first photosensitive polymer layer;
drying and illumination curing the first photosensitive polymer layer to form a first aligning layer;
forming a reflective layer on the first aligning layer at a location corresponding a reflective area;
forming a second photosensitive polymer layer on the first aligning layer and the reflective layer;
performing rubbing alignment in a second direction on the second photosensitive polymer layer;

conducting drying treatment on the second photosensitive polymer layer and conducting illumination curing treatment on the second photosensitive polymer layer directly above the reflective layer via a mask to form a second aligning layer, so as to obtain an array substrate; and cell-assembling the array substrate with a color filter substrate and filling liquid crystals between them.

2. The manufacturing method according to claim 1, wherein the first photosensitive polymer layer and the second polymer layer includes: a photosensitive polymer material and a volatile organic solvent.

3. The manufacturing method according to claim 2, wherein the photosensitive polymer material includes at least one selected from the group consisting of polyvinyl cinnamate, poly(ethylene oxide ethyl cinnamate), poly (p-phenylene diacrylate), poly(vinyl cinnamylidene acetate), divinyl-benzene, N,N-methylene-bis-acrylamide, ethylene diacrylate and benzoin esterase.

4. The manufacturing method according to claim 2, wherein the volatile solvent includes at least one selected from the group consisting of acetone, ethanol and cycloalkanes.

5. The manufacturing method according to claim 1, wherein the reflective layer is of aluminum.

6. The manufacturing method according to claim 1, wherein the first direction and the second direction are the same or different.

7. The manufacturing method according to claim 1, wherein the illumination curing is an illumination curing with ultraviolet.

8. The manufacturing method according to claim 1, wherein the drying treatment is that it is placed in an environment at 80° C. to 100° C. for four to six minutes.

9. The manufacturing method according to claim 1, wherein, after drying treatment is performed on the second photosensitive polymer layer and illumination curing treatment is performed on the second photosensitive polymer layer over the reflective layer via a mask, it further includes removing the second photosensitive polymer layer in a region other than the reflective layer, so as to expose the first aligning layer uncovered by the reflective layer.

10. A display panel, comprising:
a color filter substrate and an array substrate that are cell-assembled; and
liquid crystals, disposed between the color filter substrate and the array substrate,
wherein the array substrate includes a substrate and a pixel unit layer and an aligning layer that are formed on the substrate in sequence, and
wherein the aligning layer includes:
a first aligning layer covering the pixel unit layer;
a reflective layer that is formed on the first aligning layer and exists at a location corresponding to a reflective area; and
a second aligning layer formed directly above the reflective layer.

11. The display panel according to claim 10, wherein a total thickness of the second aligning layer and the reflective layer is one half of thickness of a liquid crystal cell of the display panel.

12. The display panel according to claim 10, wherein the pixel unit layer comprises:
pixel units surrounded by gate lines and data lines, the pixel units comprising switch elements; and
a passivation layer covering the pixel units.

13. The display panel according to claim 12, wherein area of the reflective layer occupies one half in each of the pixel units of the display panel.

14. A display device, comprising the display panel according to claim 9.

15. The manufacturing method according to claim 1, wherein, the pixel unit layer comprises:
pixel units surrounded by gate lines and data lines, the pixel units comprising switch elements; and
a passivation layer covering the pixel units.

* * * * *